(12) United States Patent
Kikugawa et al.

(10) Patent No.: US 7,370,415 B2
(45) Date of Patent: May 13, 2008

(54) MANUFACTURING METHOD OF INK-JET HEAD

(75) Inventors: Shozo Kikugawa, Akiruno (JP); Minoru Yamada, Hachioji (JP); Yuichi Akanabe, Kunitachi (JP); Takeshi Ito, Nishitokyo (JP); Tetsuo Okuno, Hino (JP)

(73) Assignee: Konica Minolta Holdings, Inc., Tokyo (JP)

( * ) Notice: Subject to any disclaimer, the term of this patent is extended or adjusted under 35 U.S.C. 154(b) by 401 days.

(21) Appl. No.: 11/104,842

(22) Filed: Apr. 12, 2005

(65) Prior Publication Data

US 2005/0212864 A1 Sep. 29, 2005

Related U.S. Application Data

(63) Continuation of application No. 10/021,216, filed on Dec. 12, 2001, now abandoned.

(30) Foreign Application Priority Data

Dec. 18, 2000 (JP) .............................. 2000-384020

(51) Int. Cl.
*B21D 53/76* (2006.01)
*C25D 5/02* (2006.01)

(52) U.S. Cl. ............ 29/890.1; 205/205; 205/655; 205/126; 427/555; 347/241; 347/68; 347/71

(58) Field of Classification Search ........... 29/890.1, 29/25.35; 205/205, 210, 219, 655, 125, 126; 427/554, 555; 347/233, 241, 68, 70, 71
See application file for complete search history.

(56) References Cited

U.S. PATENT DOCUMENTS

| 4,725,345 | A | | 2/1988 | Sakamoto et al. |
| 4,960,613 | A | * | 10/1990 | Cole et al. .................. 427/555 |
| 5,016,028 | A | | 5/1991 | Temple |
| 5,185,055 | A | | 2/1993 | Temple et al. |
| 5,302,547 | A | | 4/1994 | Wojnarowski et al. |
| 5,560,090 | A | * | 10/1996 | Komakine et al. ......... 29/25.35 |

FOREIGN PATENT DOCUMENTS

| JP | 1-298795 | * 12/1989 | ................ 205/126 |
| JP | 5-112012 A | 5/1993 | |

OTHER PUBLICATIONS

Davis et al., "Thin Film Metallization of Three-Dimensioinal Substrates", Electronic Components and Technology Conference, May 1994, pp. 359-361.*

* cited by examiner

*Primary Examiner*—A. Dexter Tugbang
(74) *Attorney, Agent, or Firm*—Frishauf, Holtz, Goodman & Chick, P.C.

(57) ABSTRACT

A method for manufacturing an inkjet print head with ink channels formed on a member including a piezoelectric body, and where ink is jetted from each of the ink channels by applying a voltage to electrodes provided on the piezoelectric body for each of the ink channels thereby driving the piezoelectric body. The method has the steps including adsorbing a catalyst onto the channel plate with the ink channel grooves; removing a part of the catalyst by a laser beam; and plating at least one side surface and a bottom surface of the channel plate to form a layer which serves as the electrodes, on the catalyst which has not been removed by the laser beam.

2 Claims, 13 Drawing Sheets

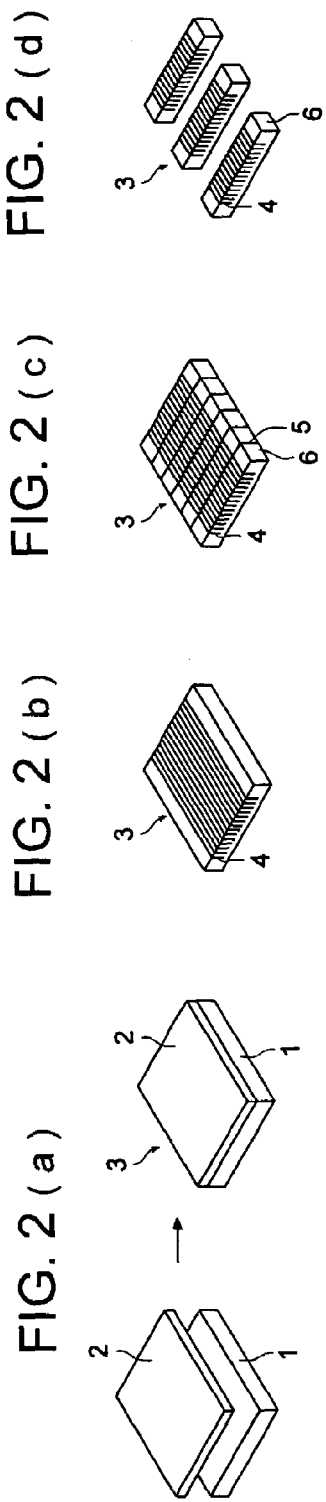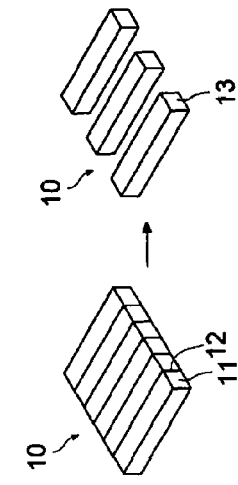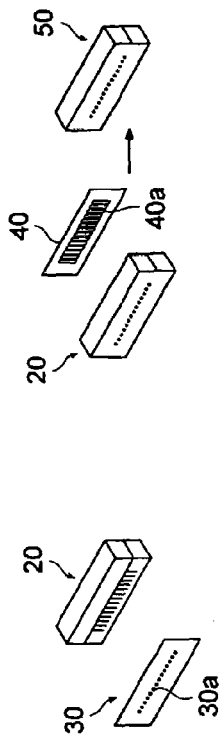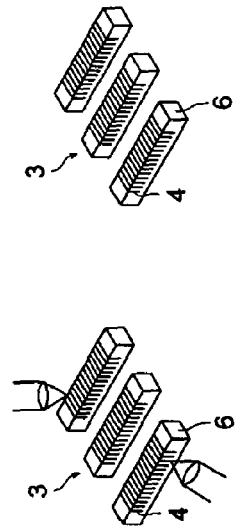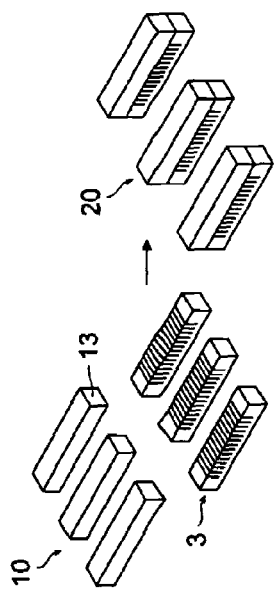

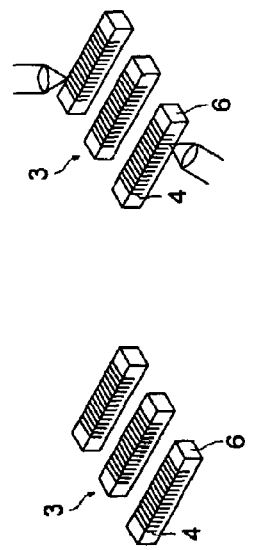 FIG. 10(e) / FIG. 10(d)

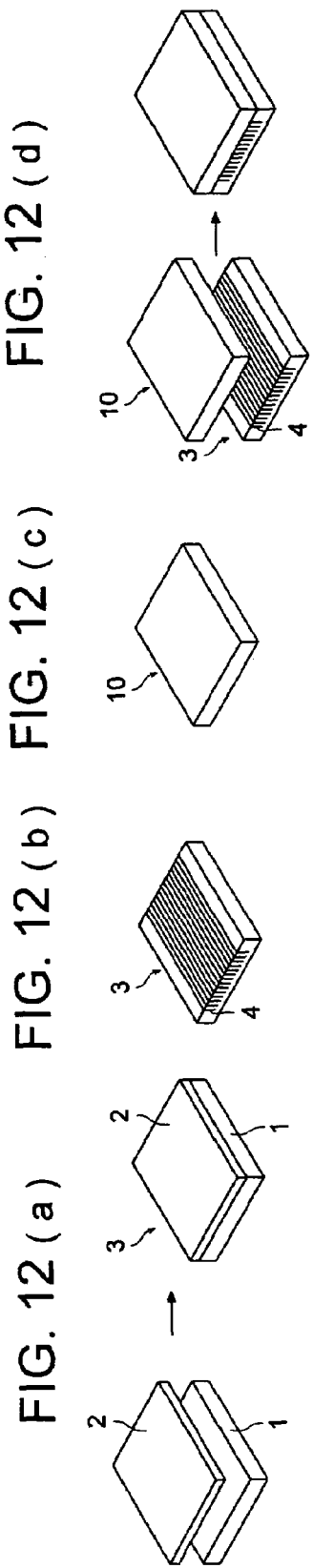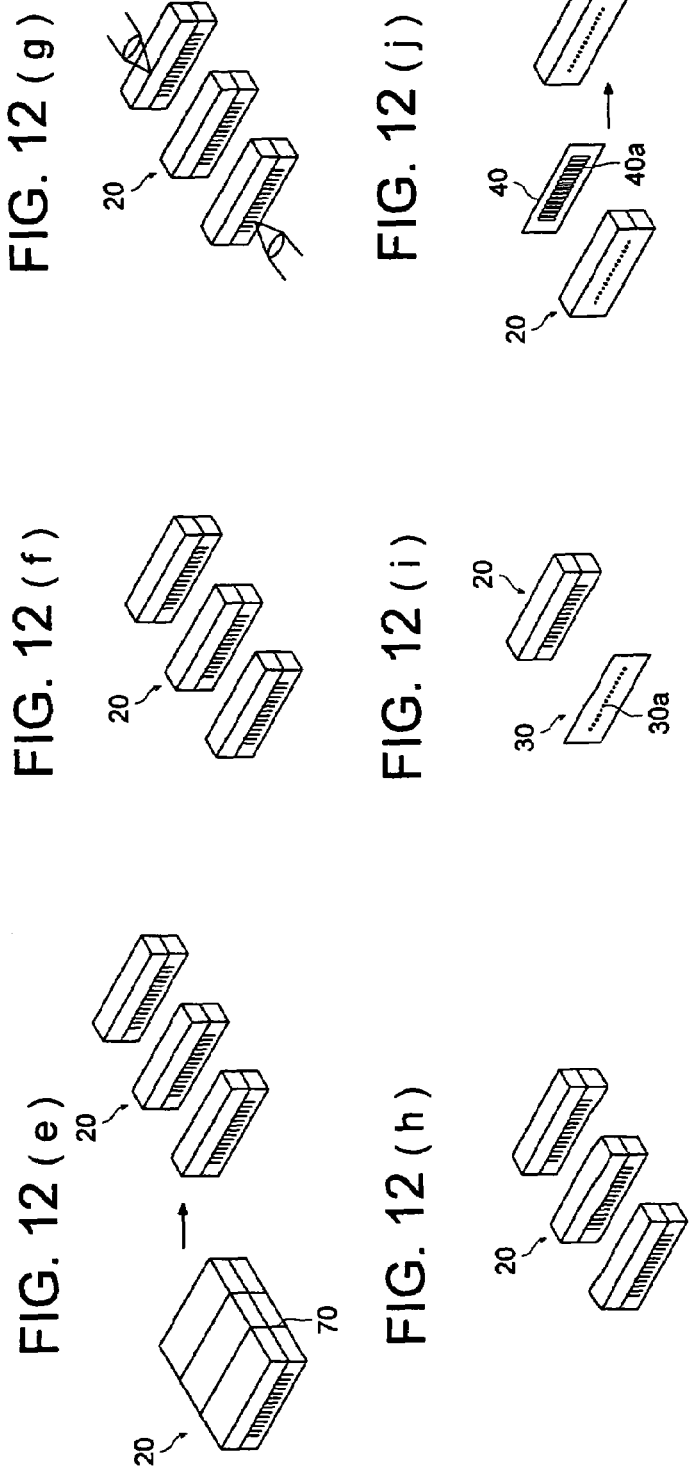

MANUFACTURING METHOD OF INK-JET HEAD

This is a Continuation Application of application Ser. No. 10/021,216, filed Dec. 12, 2001 now abandoned, which is hereby incorporated in its entirety herein by this reference.

BACKGROUND OF THE INVENTION

The present invention relates to a method of manufacturing an ink jet print head of a shear mode type using a piezoelectric element and having a high image quality, a high speed, and a high density. An ink jet print head of a shear mode type has ink channels formed in a polarized piezoelectric substrate by cutting and grinding, and has electrodes formed on the partition walls of the channel grooves; it jets ink drops when an electric field is applied to these electrodes to cause the partition walls of the grooves to be deformed to become dog-legged shape by a shearing force, to apply a pressure to ink in the grooves. For this ink jet print head, electrodes in the grooves and connection electrodes outside the grooves which transmit a signal to the electrodes are necessary. The present invention is a new method of forming the electrodes and the connection electrodes, using a laser and an electroless plating process without using a conventional photosensitive resist.

A fundamental structure of a conventional print head will be explained by referring to FIG. 14. For example, according to the publication of the examined patent application H6-61936, a polarized piezoelectric substrate is coated with a photosensitive resist by a spinning method. In another way, a photosensitive dry film is laminated on it. Subsequently, mask exposure and development is carried out to form a pattern of ink channels. Next, grooves are formed by cutting and grinding along this pattern. Each of these grooves is not uniformly formed over the whole length, but by stopping the cutting and grinding operation on the way, a straight groove portion 100, a shallow groove portion 101 having its depth made gradually smaller, and an uncut portion 102 which is not cut and ground at all are successively formed. Subsequently, aluminum is coated by evaporation coating from an oblique direction to the grooves, to cause electrodes to be formed on the partition walls of the grooves, connection electrodes to be formed on the shallow groove portions and uncut portions. By connecting the ends of these connection electrodes to a drive circuit by flexible cables, a signal can be sent to the electrodes. However, because these shallow groove portion and uncut portion is not scarcely deformed by the application of an electric voltage, they cannot contribute to the jetting of ink drops. While this ink jet print head is driven, owing to the hysteresis loss of the piezoelectric element caused by the application of a high-frequency signal voltage, it generates heat remarkably because the electric voltage is applied also to these portions that do not scarcely contribute to ink jetting. In particular, because the uncut portions 102 do not come into direct contact with ink and is not cooled by ink, the temperature rise in these portions is large. Depending on the print pattern, it sometimes occurs that some channels do a larger number of times of ink jetting and other channels do a smaller number of times of ink jetting. Because heat generation is larger in channels of a larger number of times of ink jetting, the viscosity of ink in those channels gets lowered and the speed of jetted ink drops becomes faster. As described in the above, if the speed of jetted ink drops varies from one channel to another channel depending on the print pattern, fluctuation of the landing position of the ink drops landing on a medium which is moving at a constant speed with respect to the print head is produced, which lowers image quality remarkably. This is called a cross-talk depending on the print pattern. Because this print head has a shape such that a piezoelectric element is kept between electrodes, it has the same structure as a capacitor, which makes the portions that do not contribute to ink jetting have a large capacitance; therefore, the deformation of the partition walls by a shearing force cannot respond to a high-frequency signal. That is, the structure of a conventional print head is not suitable for a head to have a high image quality, a high speed, and a high density.

A print head of the present invention is characterized by having only straight grooves from which portions not to contribute to jetting are removed. As compared to the conventional one, heat generation is small, and high-frequency response is good. However, because it has neither shallow groove portions nor uncut portions, there no space to form connection electrodes. Connection electrodes must be formed in such a cubic way that they are made to turn around the side surface to the rear surface, where they are connected to flexible cables.

The present pattern formation technology employing a photosensitive resist can form a planar pattern, but cannot form a cubic pattern. Cubic wiring used in a print circuit board or in a dashboard of automobiles is such a coarse one as to have a pitch of mm order. Cubic wiring in the present invention should be such one that, for a 300 DPI head, 70 to 520 stripes of electrodes are formed at a pitch of 80 µm in a cubic way.

The present invention provides a new method of forming a cubic pattern using an electroless plating process and a laser without using a resist.

For a high-speed print head of a high image quality, it is essential to form straight grooves having no useless portions as described in the above. However, if straight grooves are formed, a conventional method of patterning by means of a photosensitive resist cannot be used, because connection electrodes must be formed in a cubic way.

Concerning a technology to form cubic connection electrodes in an ink jet print head, for example, in a technology disclosed in the publication of the unexamined patent application H7-132589 (corresponding to U.S. Pat. No. 5,646,661), straight horizontal grooves are formed and vertical grooves are formed from one end of them respectively. Next, after processing of electroless plating, the vertical surface is ground to remove the plated metal, but plated metal layer remains in vertical grooves to become a part of connection electrodes. Because the piezoelectric element is very hard and fragile, and further, because a high-density head has a wall thickness of 50 µm or under, the partition walls of the grooves are easy to be chipped when the horizontal and vertical grooves are cut and ground.

In the publication of the unexamined patent application 2000-141653, it is disclosed a method in which the rear wall of a print head having straight grooves is masked by a photosensitive resist in a pattern shape, and then electrodes and wiring are formed by evaporation coating. However, because the thickness of the head is as thin as 2 to 10 mm, it is difficult to form a minute pattern by coating a photosensitive resist in this portion to be exposed and developed. In the publication of the unexamined patent application H10-766669, it is disclosed a technology to form a part of connection electrodes by providing a through hole in the bottom of each groove, filling it with a conductive substance. In manufacturing piezoelectric elements, even though exact holes are formed in a green sheet, when it is sintered, expansion and contraction occurs remarkably, which makes it difficult to form holes having a diameter of several tens µm with an accuracy of several µm. Further, when grooves are worked with their position adjusted to coincide with these via holes, it is produced a problem that the positions are deviated for example. In the publication of the unexamined patent application 2000-168094, it is disclosed a method in which the whole of a head having straight grooves is plated, and then, a part of the plating layer is removed by a laser beam, to form connection electrodes. In the publication of the unexamined patent application H8-300667, it is disclosed a method in which electrodes are formed on the inner surfaces of grooves and electrodes formed on the bottom surface of the grooves are removed by a YAG laser. Because a plated metal, for example, nickel is very hard, a large laser power is necessary in order to remove it by evaporation; because laser working is pulse application for a short time of several hundreds nS or under, only the surface layer is rapidly heated to evaporate nickel, and influence to the part under the surface layer is small. However, if the film thickness is large, repeated irradiation is necessary, and there is a possible risk of the deterioration of the underlying piezoelectric element which is weak against heat.

The present invention is a method in which straight channels are formed in a piezoelectric substrate, and there are formed electrodes inside the channels and a cubic wiring for connection outside the channels by an electroless plating process or by an electrolytic plating process and a laser. It is a new method to form electrodes and cubic connection electrodes using plating and a laser without using a photosensitive resist.

The present invention is a new method of forming electrodes and cubic connection electrodes in an ink jet print head by electroless plating or by electrolytic plating and a laser. Up to now, for example, according to the publications of the unexamined patent applications 2000-168094 and H8-300667, after the whole of a print head is plated in an electroless way, unnecessary portions of the plating layer are removed by a laser beam; however, because the plated metal, for example, nickel is a very hard metal, a large laser power is necessary, and there is a possible risk of the underlying piezoelectric element being overheated. When a piezoelectric element is heated to the Curie temperature or over, for example 200 to 300° C., it loses the polarization to be brought into a state of exhibiting no piezoelectricity. Hence, it is necessary to suppress the temperature rise under the half of the Curie temperature. It sometimes happens that when a hard nickel layer on a piezoelectric element is evaporated by a laser beam, the temperature of the piezoelectric element reaches several hundreds degrees locally.

These prior arts are all methods of forming a pattern by evaporating useless parts of plated metal by a laser beam after the metal is plated in an electroless way. Because, in the present invention, a pattern is formed by a laser before electroless plating or on the way of electroless plating, only a low laser power is required, and no excessive heat is applied to the underlying piezoelectric element.

Electroless plating is a method of depositing a metal layer on a support body having no electrical conductivity by chemically reducing a solved metallic salt. Because it is not based on electrolytic reduction which occurs in electrolytic plating, reduction ability is not so strong, that a metal is not deposited solely by it; therefore, it is necessary to make a plating catalyst adsorbed beforehand on a supporting body. By electroless plating, metal can be deposited only on a plating catalyst layer, but once metal is deposited, the plating layer grows because the metal has a self-catalyzing function.

The outline of a method of forming electrodes and connection electrodes and a method of assembly of a head based on a conventional technology will be explained by referring to FIG. 15(a) and FIG. 15(b). A plurality of straight grooves 110 are formed in a polarized piezoelectric substrate. Next, a plating catalyst is adsorbed by this head substrate, and electroless plating is carried out. In this state, the whole of the head substrate is uniformly plated. By grinding the front end 111 of the head substrate, that is, the surface to which a nozzle plate is bonded, the plated metal is removed. Next, by applying a laser beam to the part passing from the roof 112 of the partition walls of the grooves, through the rear end of the head 113, to the bottom surface of the head 114, the plated metal on the above-mentioned line-shaped area is removed; thus, electrodes 115 and connection electrodes 116 which are independent for each of the grooves can be formed. Subsequently, by bonding a top plate with an adhesive, the grooves are covered, and by bonding a nozzle plate, an ink inlet plate and a manifold, and connecting flexible wires to the bottom surface of the head, an ink jet print head is completed. In another way, the plated metal on the part of the roofs 112 of the partition walls may be removed by grinding. The present invention is an improvement of this process. Because a part of a plating film is removed before the thick layer is formed or on the way of plating not after the thick film has been formed, it is a method in which only a small power for a laser beam is necessary for a short time, and thermal influence to the piezoelectric element is small.

It is an object of the present invention, by eliminating the various defects of conventional technologies, to provide a method of manufacturing an ink jet print head which is capable of manufacturing at a low cost a high-density print head having a high image quality, a high printing speed, and little cross talk and being small-sized and capable of being driven by a low electric current.

SUMMARY OF THE INVENTION

For the purpose of solving the above-mentioned problems and accomplishing the object, the present invention has any one of the structures described below.

The invention of structure 1 is a method of manufacturing an ink jet print head which has channels formed of a member including a piezoelectric body, and jets ink from the channel by the application of an electric voltage to electrodes to drive the piezoelectric body, characterized in that, in the method, after a catalyst layer is adsorbed over the whole surface of the channel plate having a plurality of channel grooves and a thin electroless plating film is formed on the channel plate, a laser beam is applied to at least one side surface and the bottom surface of the channel plate to remove the thin plating film at the irradiated portion, and then plating is practiced again to form electrodes and cubic connection electrodes.

In addition, the term "electrodes" in every structure implies both of electrodes provided on the inner walls of each channel and connection electrodes connected to the electrodes which are provided outside each channel, respectively.

According to the description set forth in this structure 1, the invention is a method in which a plating film thinner than the thickness required for electrodes is previously formed, and after the thin plating film deposited on the portions for which no plating is necessary is removed by a laser beam, plating processing is done over again. In doing plating over again, by the self-catalyzing function of the thin plating film remaining not removed, further plating film is deposited on the places where the thin plating film remains, to form electrodes and connection electrodes. Because a plating film which is thinner than that to be removed in conventional methods is removed by a laser beam, only a small power for a laser beam is necessary, the deterioration of the property of the piezoelectric body is prevented, electrode formation with a good production efficiency can be performed, and generation of defective products in the manufacturing process is suppressed, which makes it possible to manufacture a high-precision ink jet print head, whose miniaturization is in progress, at a low cost.

The invention of structure 2 is a method of manufacturing an ink jet print head which has channels formed of a member including a piezoelectric body, and jets ink from the channels by the application of an electric voltage to electrodes to drive the piezoelectric body, characterized in that, in the method, after a plating catalyst layer is adsorbed by a channel plate having a plurality of channel grooves, a laser beam is applied to at least one side surface and the bottom surface of the channel plate to remove the catalyst layer adsorbed at the portions where the plating is not required, and then plating is practiced to form electrodes and cubic connection electrodes on the portions which are not irradiated by the laser beam.

In the invention set forth in this structure 2, the metal for electrodes should desirably be nickel or copper, and especially, nickel is more desirable because of corrosion resistance.

In the invention of structure 3, after a catalyst layer is adsorbed over the whole surface of the channel plate, the catalyst layer on the places for which no plating is necessary is removed by a laser beam, and after that, by applying electroless plating, a plating film is deposited on the places where the catalyst layer remains, to form electrodes and connection electrodes. Because only it is necessary to remove adsorbed catalyst layer having a weight if ng order or to inactivate it by thermal oxidization, only an extremely small power is necessary for the laser, the deterioration of the property of the piezoelectric body is prevented, electrode formation with a good production efficiency can be performed, and generation of defective products in the manufacturing process is suppressed, which makes it possible to manufacture a high-precision ink jet print head, whose miniaturization is in progress, at a low cost.

The invention of structure 4 is a method of manufacturing an ink jet print head which has channels formed of a member including a piezoelectric body, and jets ink from said channels by the application of an electric voltage to electrodes to drive said piezoelectric body, characterized in that, in said method, a channel plate having a plurality of channel grooves and a cover plate are bonded to each other to make up a head tip, and after an electroless plating film is formed on the inner wall surface of a plurality of tube-shaped channels formed in this head chip and on the outer peripheral surface, the plating film on specified portions of said outer peripheral surface is removed by a laser beam, to form a plurality of electrodes and connection electrodes corresponding to said channels on the outer peripheral surface of said head tip.

According to the invention set forth in this structure 4, after a plating film is formed on the inner walls of a plurality of tube-shaped channels formed on a head tip and the outer peripheral surface by applying plating processing to the inner wall surface, the plating film on specified portions of the outer peripheral surface is removed by a laser beam, to form electrodes in the channels and connection electrodes on the outer peripheral surface of the head tip. Because the top plate is bonded before plating, it is unnecessary to irradiate the roof portion of the partition walls of the grooves by a laser beam; therefore, laser irradiation time becomes shorter. Because the partition walls of the grooves, which are concerned with the jetting of ink drops, are not irradiated by a laser beam, and only it is necessary to irradiate the outer surface of the head tip, which does not influence the jetting of ink so much, deterioration caused by heat is not produced so much, and plating of only one time is necessary. Thus, the deterioration of the property of the piezoelectric body is prevented, electrode formation with a good production efficiency can be performed, and generation of defective products in the manufacturing process is suppressed, which makes it possible to manufacture a high-precision ink jet head, whose miniaturization is in progress, at a low cost.

In the invention of structure 5, after a thin plating film is formed on the inner walls of a plurality of tube-shaped channels formed on a head tip and on the outer peripheral surface, the plating film on specified portions of the outer peripheral surface is removed by a laser beam, and electroless plating is carried out again, to form electrodes in said channels and connection electrodes on the outer peripheral surface of the head tip. Because the top plate is bonded before plating, it is unnecessary to irradiate the roof portion of the partition walls of the grooves by a laser beam; that is, it is not required to irradiate the portions which are directly concerned with ink jetting by a laser beam. The deterioration of the property of the piezoelectric body is prevented, and generation of defective products in the manufacturing process is suppressed, which makes it possible to manufacture a high-precision ink jet head, whose miniaturization is in progress, at a low cost.

In the invention of structure 6, it is desirable to use nickel or copper for the metal of the electrodes, and in particular, nickel is desirable because it is excellent in resistivity against corrosion.

In the invention of structure 7, after a catalyst layer is adsorbed on the inner walls of a plurality of tube-shaped channels and on the outer peripheral surface, the catalyst layer on the unnecessary portions is removed by the application of a laser beam, and plating is carried out. Because the catalyst layer is partially removed, an extremely weak laser beam may be used.

BRIEF DESCRIPTION OF THE DRAWINGS

FIG. 2(a) to FIG. 2(j) are outline drawings showing a manufacturing process of an ink jet print head;

FIG. 10(a) to FIG. 10(j) are outline drawings showing a manufacturing process of an ink jet print head;

FIG. 12(a) to FIG. 12(j) are outline drawings showing a manufacturing process of an ink jet print head;

DETAILED DESCRIPTION OF THE PREFERRED EMBODIMENT

In the following, the embodiment of a method of manufacturing an ink jet print head of the present invention will be explained on the basis of the drawings, but the present invention is not limited to this embodiment.

Figure 15:
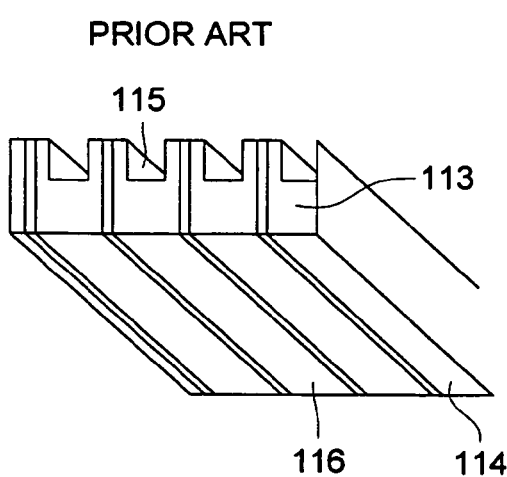
FIG. 15(a) is a perspective view of a channel plate as seen from the bottom side.
FIG. 15(b) is a perspective view showing a channel plate from which the thin plating film is removed by a laser beam.
Figure 15:
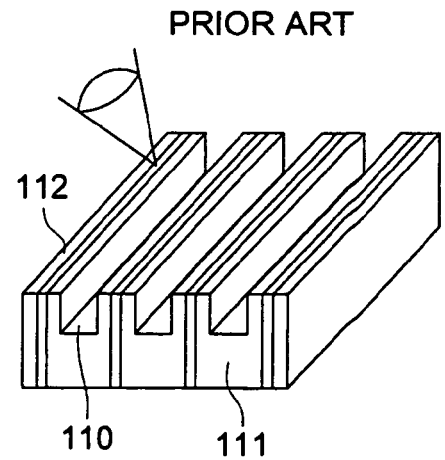

To state the first example of the present invention, in electroless plating which is applied to a head substrate having straight grooves formed, when an extremely thin plating layer having a thickness of 0.5 μm for example has been produced, it is taken out from the plating bath and is washed by water, and then, as shown in FIG. 15(a) and FIG. 15(b), a laser beam is applied to linear areas extending from the roof of the side wall of grooves, through the rear end surface, to the bottom surface of the head, to remove the plated metal on them. Because the amount of metal to evaporate is very small, the temperature of the piezoelectric substrate is not so much raised. After washing, it is put into the plating bath again; then, plating layer begins to grow again because the metal layer having been already deposited has a self-catalyzing function. However, on the portions from which the metal layer has been removed by the laser beam, plating metal is not deposited. When the plating metal on the front end of the head substrate is removed by grinding, electrodes and cubic connection electrodes are formed independently for each of the grooves. Because electroless plating is of high cost, and has a low plating speed, also it is appropriate to employ electrolytic plating for plating again.

In the second example of the present invention, after a catalyst for electroless plating is adsorbed on a head substrate having straight grooves formed, a laser beam is applied to linear areas extending from the roof of the wall of grooves, through the rear end surface of the head, to the bottom surface of the head, to remove the catalyst layer on them, and then, electroless plating is carried out. Because the amount of the adsorbed catalyst, for example palladium, is in an order of ng, and if it is oxidized by heating to be inactivated without evaporating, an extremely weak laser power is enough for it. Because a catalyst is chemically active, it is easy to be oxidized by air; therefore, it is necessary that nitrogen gas is made to flow over the portions to be irradiated by a laser beam to prevent oxidization, and at the same time, to remove the evaporated substance. Subsequently, electroless plating is continued and finished, and the plated metal on the front end surface of the head substrate is removed by grinding; then, electrodes and cubic connection electrodes can be formed independently for each of the grooves.

In the third example of the present invention, a top plate is bonded to a head substrate having straight grooves formed, to cover the ink grooves. A catalyst layer is adsorbed and electroless plating is carried out. Because the partition walls which are directly concerned with the jetting of ink drops are not irradiated by a laser beam, and only the portions which are not so much concerned with the jetting of ink drops are irradiated by a laser beam, plating only once instead of plating twice is also appropriate. Alternatively, when a thin plating film is deposited, the head tip is taken out from the plating bath, and after washing by water and drying, a laser beam is applied to the linear areas extending from the rear end surface of the head substrate to the bottom surface of it, to remove the plated metal on them. It is put into the plating bath again, to resume plating. In another way, it is subjected to electrolytic plating which is low cost. By removing the plated metal on the front end surface of the head substrate by grinding, electrodes and cubic connection wires can be formed independently for each of the grooves. Because the straight grooves are covered by the top plate, the irradiation by a laser beam is not required.

In the fourth example of the present invention, which is similar to the third example, after the adsorption of a catalyst layer to the partition walls in direct relation to the jetting of ink, a laser beam is applied to the linear areas extending from the rear end surface to the bottom surface of the head substrate in a nitrogen flow to remove the catalyst layer on them, and then, plating is carried out. Accordingly, only an extremely small irradiation is necessary for the laser.

First, the first example of the embodiment will be explained.

Figure 1:
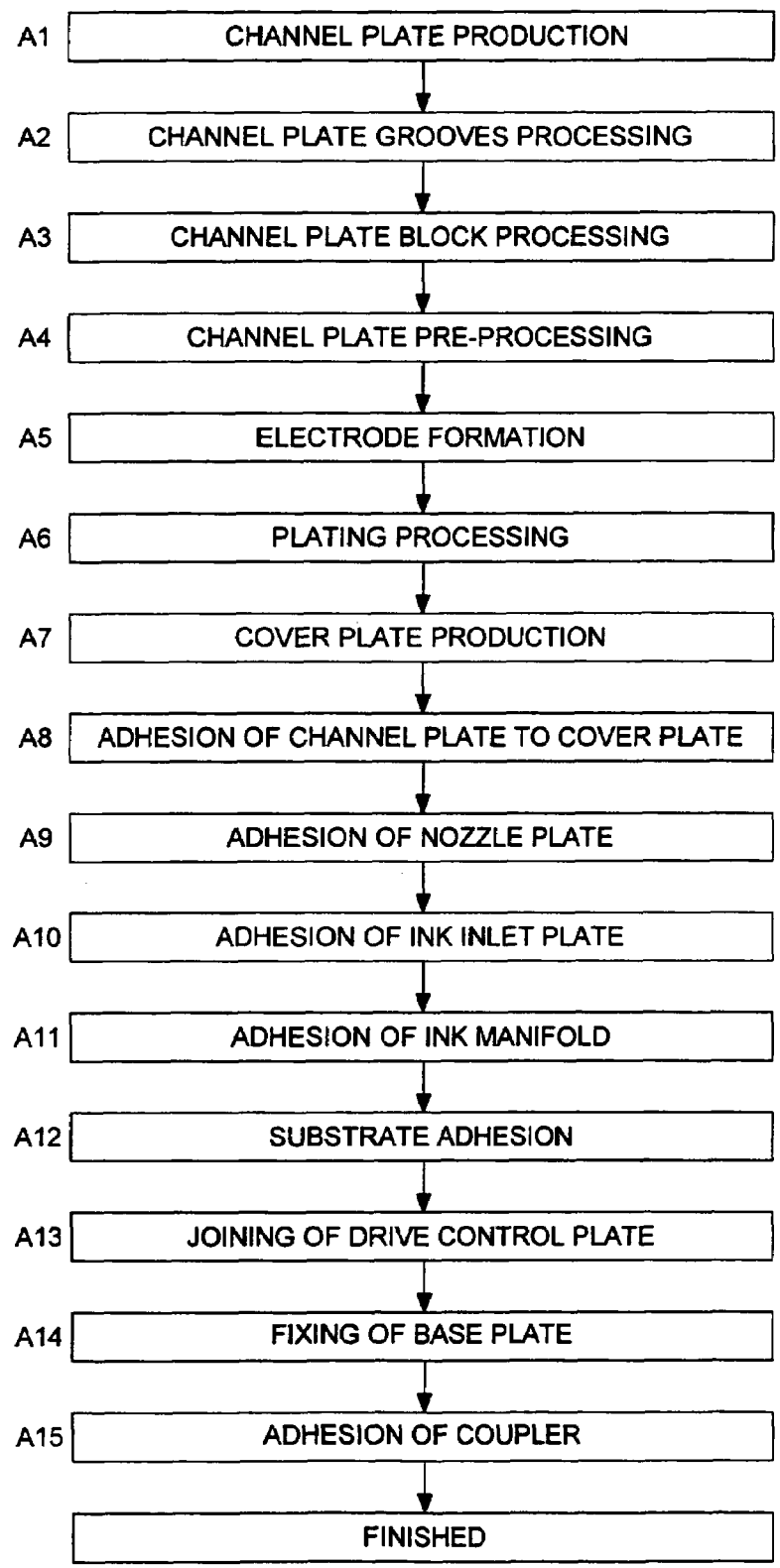
FIG. 1 is a flow chart of a manufacturing process of an ink jet print head.
Figure 3:
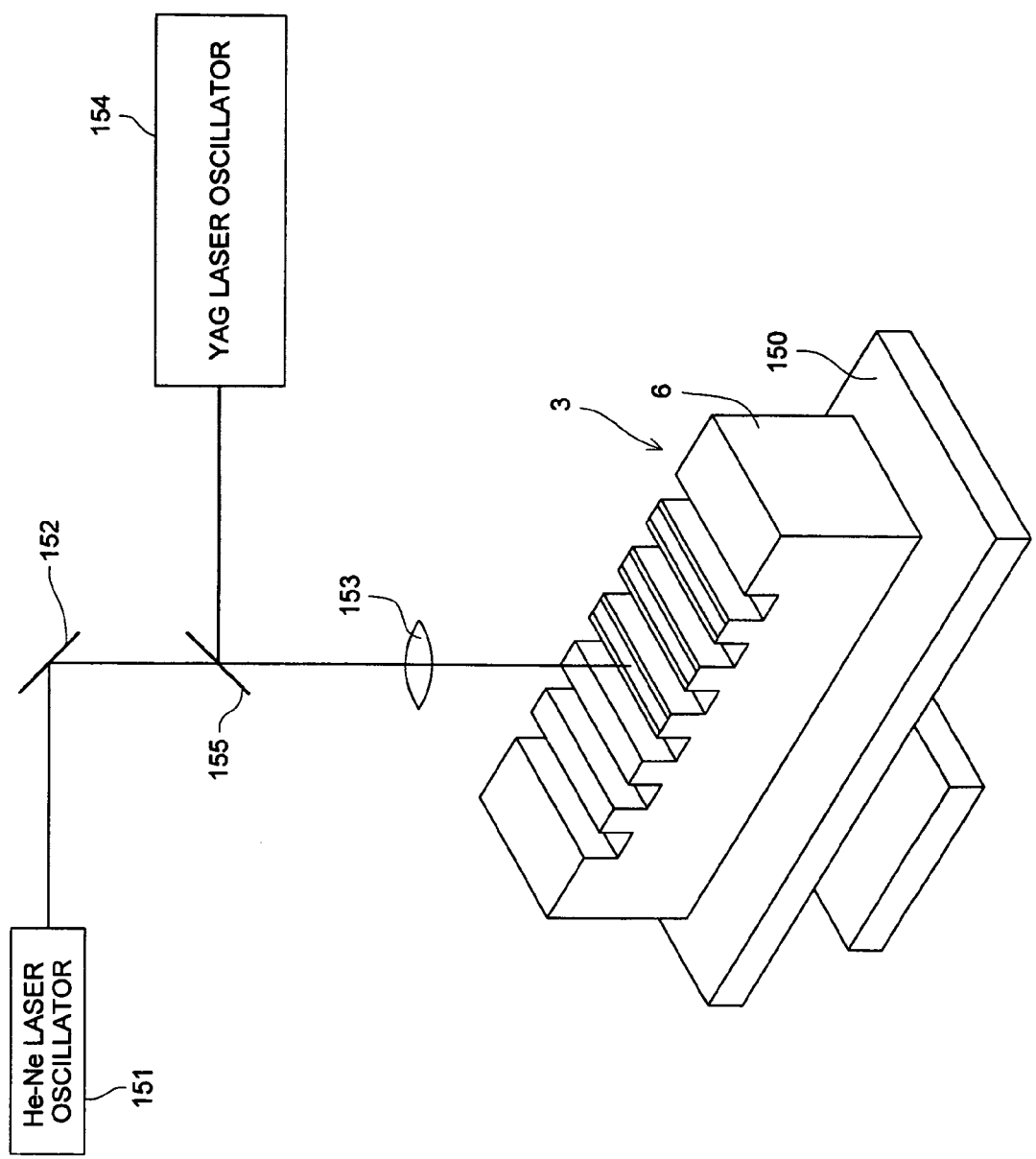
FIG. 3 is a drawing showing the application of a laser beam.
Figure 4:
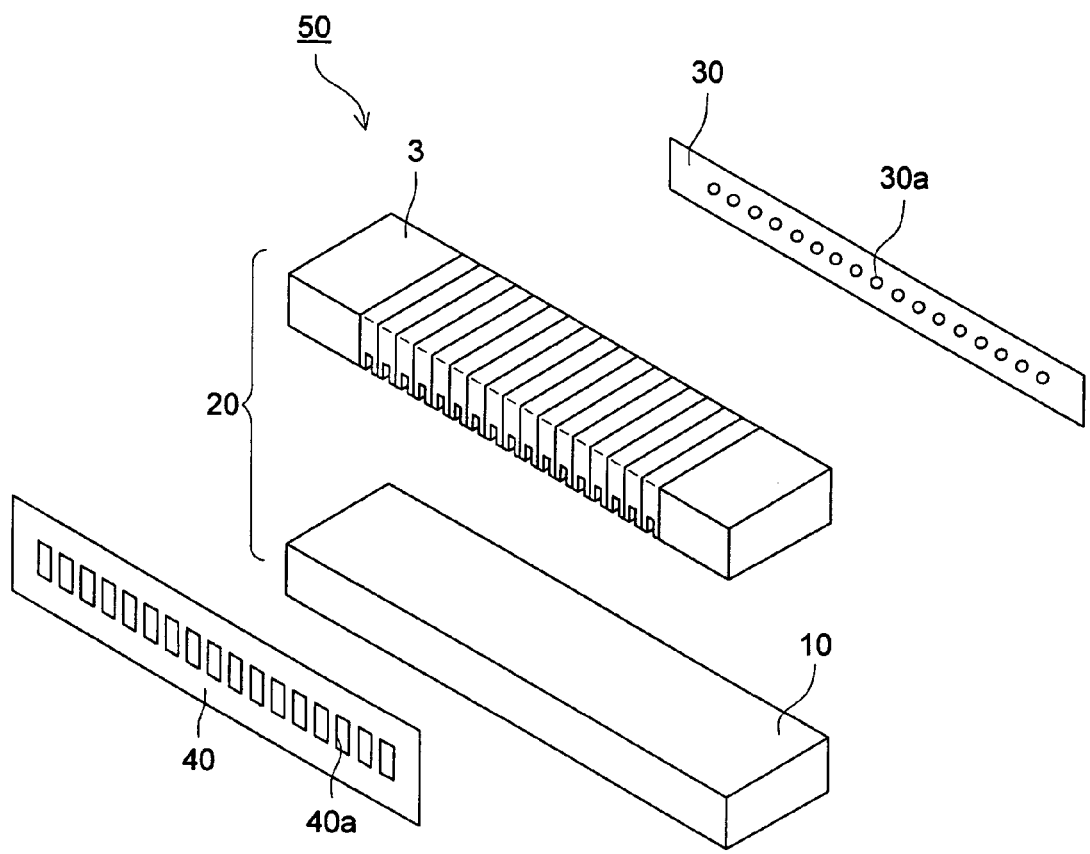
FIG. 4 is an exploded perspective view of a head block.
Figure 5:
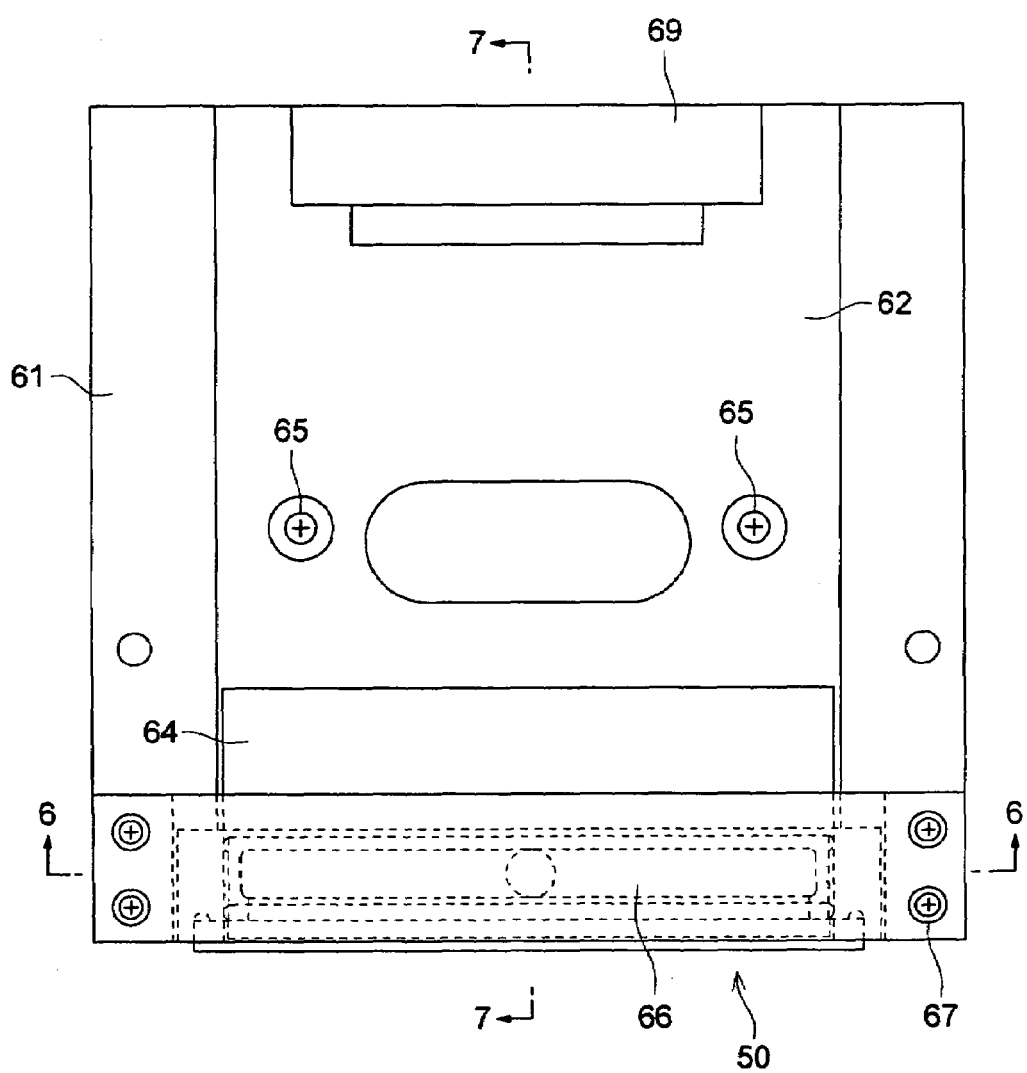
FIG. 5 is the plan of an ink jet print head.
Figure 6:
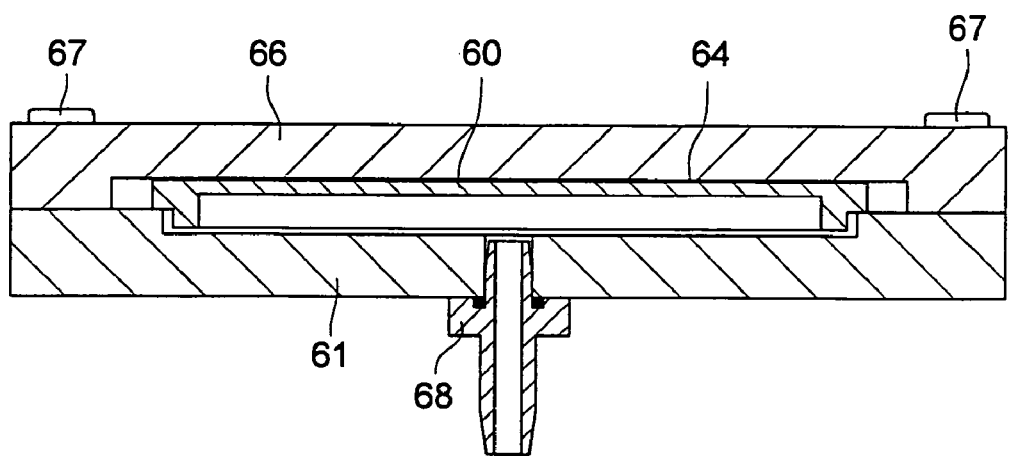
FIG. 6 is the cross-sectional view at the 6-6 line in FIG. 5.
Figure 7:
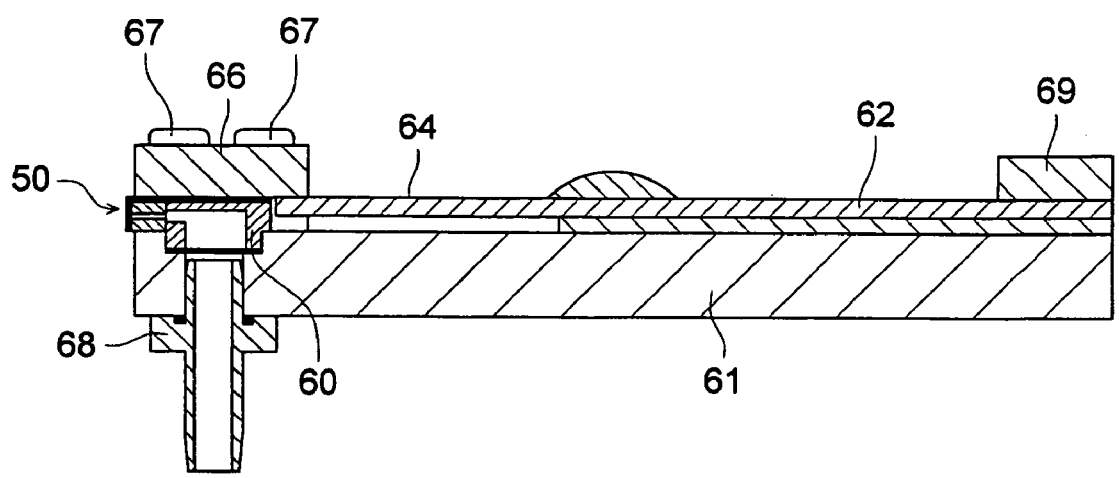
FIG. 7 is the cross-sectional view at the 7-7 line in FIG. 5.
Figure 8:
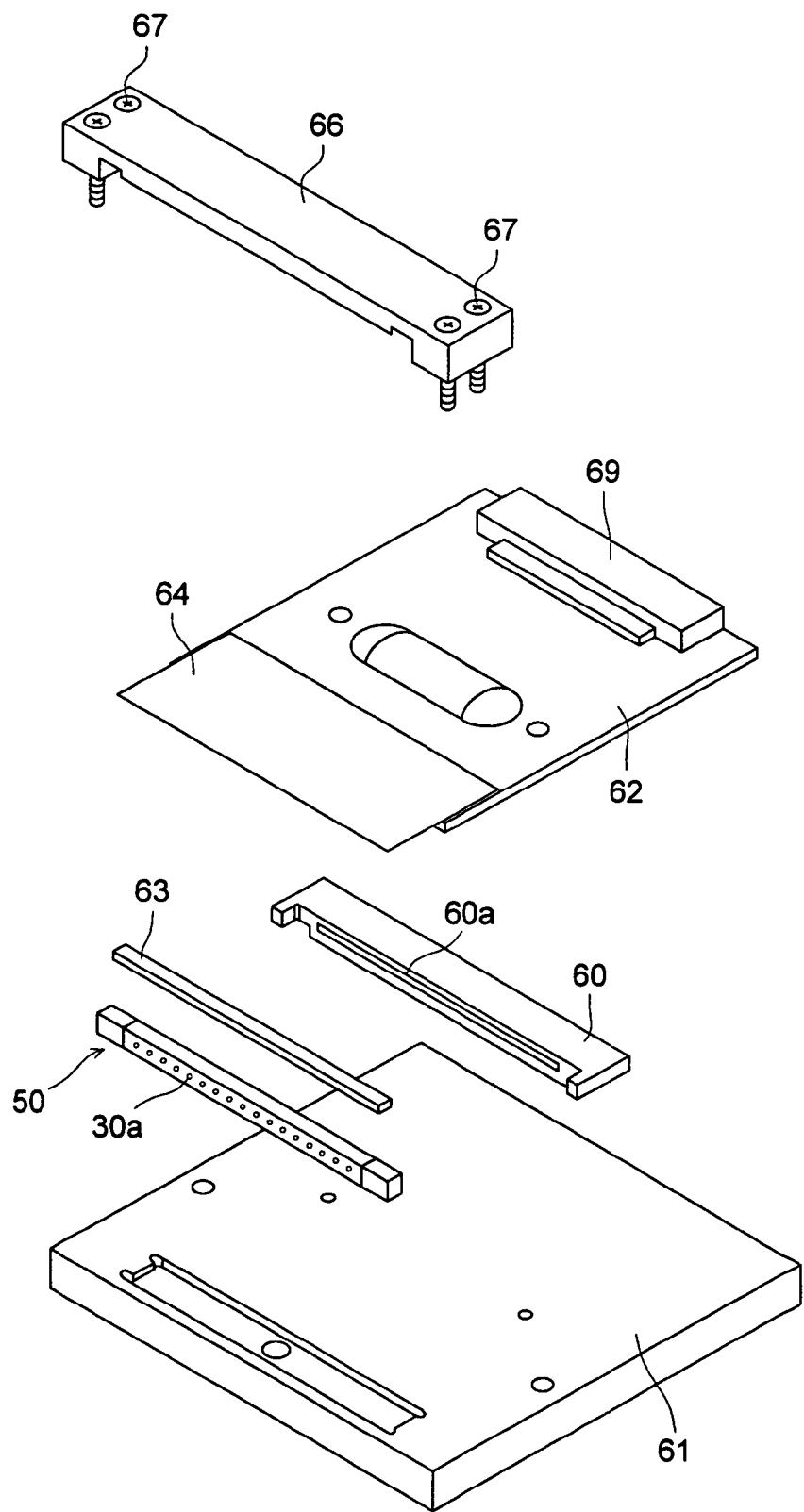
FIG. 8 is a perspective view showing an assembly process of an ink jet print head.

FIG. 1 is a flow chart of a manufacturing process of an ink jet print head; FIG. 2(a) to FIG. 2(j) are outline drawings showing a manufacturing process of an ink jet print head; FIG. 3 is a drawing showing the application of a laser beam; FIG. 4 is an exploded perspective view of a head block; FIG. 5 is the plan of an ink jet print head; FIG. 6 is the cross-sectional view at the 6-6 line in FIG. 5; FIG. 7 is the cross-sectional view at the 7-7 line in FIG. 5; and FIG. 8 is a perspective view showing an assembly process of an ink jet print head.

In the first example of the embodiment, manufacturing of ink jet print head is carried out in the order of channel plate producing process A1, channel plate groove working process A2, channel plate block working process A3, channel plate pre-treatment process A4, electrode forming process A5, plating process A6, cover plate producing process A7, channel plate-cover plate bonding process A8, nozzle plate bonding process A9, ink inlet plate bonding process A10, ink manifold bonding process A11, base body bonding process A12, drive control circuit board connecting process A13, board fixing process A14, and coupler bonding process A15.

In the following, the manufacturing process of this ink jet print head will be explained.

(Channel Plate Producing Process A1)—FIG. 2(a)

A thin plate member 1 made of a PZT material, having a thickness of 0.9 mm and a thin plate member 2 made of a PZT material having a thickness of 0.155 mm, both of which have been subjected to a polarization treatment in the width direction, are adjusted to the respective directions in respect of their polarization, and pressed with a load falling within a range of 14 to 20 Kg/cm$^2$, while they are heated to a temperature of about 90 to 100° C. for about 30 to 40 minutes, to be bonded together, which makes the adhesive layer have a thickness of about 2 μm; thus, a channel plate 3 having a thickness of 1.057 mm including the adhesive layer is produced.

In respect of this channel plate producing process A1, it is important that the operation is carried out in a clean room in order that dusts etc. may not adhere to the bonding surfaces, and close attention is paid in order that uneven bonding, bubbles, etc. may remain behind.

It is for the purpose of making larger the deformation of partition walls during the application of a voltage, by forming the partition walls of the channels of the ink jet print head of a shearing mode, of two PZT plates, that the two PZT plate members 1 and 2 are bonded to each other.

(Channel Plate Groove Working Process A2)—FIG. 2(*b*)

The grooves 4 which make the channels are formed by the cutting working of the channel plate 3.

In this case of the first example of the embodiment, in order to form 128 ink channels, with a blade having a thickness approximately equal to the width of the grooves, from the side of the plate 2 having the 0.155 mm thickness of the channel plate 3, a total of 263 grooves having a depth of 0.31 mm, a groove width of 0.07 mm, and a partition wall width of 0.071 mm, that is, with a pitch of 0.141 mm are worked to have a shape of the teeth of a comb.

In this case of the first example of the embodiment, because air channels are provided at the both sides of each ink channel, 257 grooves are necessary; further, holding portions with a length of 4 mm are provided respectively at the both sides of the 257 grooves, and in these holding portions, three spare grooves for each portion are provided successively to the above-mentioned 257 grooves, to make the total 263 grooves.

Besides, the three grooves at each of the both sides are so called glue-guards which are provided in order that the adhesive may not come over into the nozzle area, and on top of it, it is possible to make them function as spare channels for such a case that an unexpected situation occurs in some nozzles in the nozzle area.

(Channel Plate Block Working Process A3)—FIG. 2(*c*)

The channel plate 3, which has a plurality of grooves 4 formed, is cut at positions 5 in accordance with the size of an ink jet print head to have blocks 6.

In this case of the first example of the embodiment, the channel plate 3 having a thickness of 1.057 mm is cut into pieces of blocks each having a shape of width 2 mm and length 44.166 mm.

(Channel Plate Pre-Treatment Process A4)—FIG. 2(*d*)

The block 6 of a channel plate 3 is coated with a plating film which is thinner than the proper thickness of plating 2 to 5 µm. For example, a thin film plating with a thickness not greater than 1 µm is applied. The thickness of the plating layer is measured by an X-ray fluorescence thickness meter.

(Electrode Forming Process A5)—FIG. 2(*e*)

After a thin film plating is applied beforehand to the block 6 of the channel plate 3, and the thin plating film on the unnecessary portions is removed by a laser beam, both electrodes and connection electrodes having desired thickness are formed by doing plating process over again. In this way, by means of a process such that, after a part of a thin plating film, which has been formed at least on one side surface and the bottom surface of the channel plate 3 having a plurality of channel grooves is removed by a laser beam, plating processing is done over again, electrodes and connection electrodes are formed by the further deposition of plating metal on the thin plating film which has not been removed. Hence, because the plating layer to be removed by a laser beam has a thickness smaller than that required properly, the metallic plating layer can be removed by a laser beam having a comparatively small power. Hence, the deterioration of the property of the piezoelectric body which is produced at the time of removing the plating layer by a laser beam can be prevented.

The removal of the thin film by a laser beam is carried out by an apparatus shown in FIG. 3. The laser beam from a He—Ne laser generator 151 is used for indicating the position of irradiation by the laser beam from a YAG laser generator 154 for removing a plating layer. A pattern is formed on a thin plating film by laser trimming in the following way: The channel block 6 of a channel plate 3 is placed on an XY table 150 capable of moving in the X direction and Y direction; first, a laser beam is applied from the He—Ne laser generator 151 through the reflecting mirror 152 and the convergent lens 153 to the channel block 6, to indicate the position to be irradiated by the laser beam from the YAG laser generator 154, and next, a laser beam is applied from the YAG laser generator 154 through the reflecting mirror 155 and the convergent lens 153 to the thin plating film on the channel block 6.

(Plating Process A6)—FIG. 2(*f*)

As described in the foregoing, because a thin plating film having a thickness not greater than 1 µm is formed beforehand, and the thin plating film on the portions where electrodes and connection electrodes are unnecessary has been removed by a laser beam, in this plating process A6, plating processing is done over again so as to obtain a specified thickness. Either electroless plating or electrolytic plating for re-plating process is appropriate.

(Cover Plate Producing Process A7)—FIG. 2(*g*)

In order to cover the upper surface of the channel plate 3, a cover plate 10 is produced using the same material PZT as the channel plate. Because this cover member needs neither groove working nor polarization treatment, it is unnecessary that the material is PZT, but if the cover member is made of a material whose mechanical property is remarkably different from that of a PZT material, it influences badly the generation of a shearing force in the PZT member, which influences the ink jetting performance of the head etc., and further, bending or deformation is produced after the bonding to the channel plate; therefore, it is desirable that the cover member has properties such as mechanical strength and the linear coefficient of expansion which are equal to or extremely approximate to those of the PZT member; in this example of the embodiment, the same plate member as the thicker plate member which has been used in producing a channel plate is commonly used after depolarization treatment.

(Channel Plate-Cover Plate Bonding Process A8)—FIG. 2(*h*)

A block 6 of a channel plate 3 having electrodes formed and a block 13 of a cover plate 10 are bonded to each other.

In this first example of the embodiment, an amount of adhesive with a weight of about 1 mg is uniformly coated on the block 13 of the cover plate 10 to make an adhesive layer about 2 µm thick, and it is bonded to the block 6 of the cover plate 10 by heating. The condition of bonding through heating is the same as the condition of bonding at the time of producing a channel plate 3.

(Nozzle Plate Bonding Process A9)—FIG. 2(*i*)

After the end surface of a head tip 20 is ground, a nozzle plate 30 is bonded to it. The nozzle plate 30 is formed of a sheet-shaped thin plate generally made of a stainless steel material or a resin material such as a polyimide having a plurality of through holes 30*a* for jetting ink provided. The dimensions relating to the shape such as the diameter of the through holes (nozzle diameter), the thickness, the width, and the length of the nozzle plate are different in accordance with the specification of the ink jet apparatus; in this example of the embodiment, a polyimide resin sheet having a thickness of about 125 µm is processed by an eximer laser beam to form 128 through holes (nozzles) 30a having a hole diameter of about 18 m, and on the surface of the nozzle plate, ink-repellent treatment is applied in order that the holes 30a may not be influenced by the scattered ink drops.

An amount of adhesive is coated on a specified part of the nozzle plate 30 or on a specified part of the head tip 20, to bond the nozzle plate 30 to the head tip 20, and then the bonding strength is made higher by the following procedures that the bonded body is inserted in a heating device, then it is heated, for example in this example of the embodiment, at a temperature of about 80° C. for about 40 minutes, although this condition varies with the kinds of the adhesive used, the objects of bonding, etc., and further it is heated at about 100° C. for 20 minutes, to raise the bonding strength.

Besides, the bonding process must be carried out with enough care taken in order that the nozzle plate 30 may keep parallel surfaces and the adhesive may not fill the inside of the ink channels, and in such a manner that no leakage of ink occurs when ink is injected, and each of the ink channels certainly forms an independent space separately. In order that the nozzles 30a may not be stopped up by the adhesive, it is important to practice the control of the amount and the layer thickness of the adhesive. In addition, if the wettability of the adhesive is enhanced by applying plasma processing to the head tip 20, bonding is performed easily and certainly. Therefore, it is desirable to apply plasma processing to the head tip 20, because not only the bonding of the nozzle plate 30 but also the bonding of the ink inlet plate is to be done.

(Ink Inlet Plate Bonding Process A10)—FIG. 2(j)

An ink inlet plate 40 is bonded to the other of the end surfaces of the head tip 20 to one of which the nozzle plate 30 has been bonded, to produce a head block 50.

Besides, the ink inlet plate 40 has a function to let ink not flow into the channels at the both sides of each ink channel having the through hole (nozzle) 30a, and a function to make it possible to prevent the pressure generated in the ink channels for jetting ink from escaping to the manifold.

In this first example of the embodiment, the ink inlet plate 40 is formed of a polyimide sheet, the same material as the nozzle plate 30, having a thickness of 125 µm, and is provided with 128 rectangular-shaped holes 40a of width 110 µm and length 350 µm at a pitch of 282 µm. Of course, these dimensions relating to the shape are based on the specification etc. of the ink jet apparatus in the same way as the nozzle plate 30, and it is needless to say that the present invention is not limited to this example.

(Ink Manifold Bonding Process A11)

When a nozzle plate 30 and an ink inlet plate 40 have been bonded to a head tip 20, as shown in FIG. 4, a head block 50 is completed. It is necessary to fix a ink manifold member 60 to this head block 50 with an adhesive so as to make it possible to supply ink as shown in FIG. 6 to FIG. 8.

(Base Body Bonding Process A12)

Further, a ink manifold is made up through bonding a head unit, to which a head block 50 and a ink manifold member 60 have been bonded with an adhesive, to a base body 61 with an adhesive, to be brought in a state where ink can be injected in the head unit. In bonding the head unit, attention should be paid so as not to produce a positional deviation and a tilt of the head block 50 of the head unit to the base body 61, while attention should be paid also so as not to produce leakage of ink from the periphery of the ink manifold member 60 to be bonded to the base body 61.

(Drive Control Board Connecting Process A13)

A drive control board 62 for applying an electric voltage for jetting ink is connected to a head unit which has been completed to a degree such that ink can be injected into it.

In this first example of the embodiment, the electrodes which have been formed on the channel plate 3 of the head tip 20 are electrically connected to a flexible print circuit (FPC) 64 provided on the drive control board 62, using an anisotropic conductive film (ACF) 63 with heat and a pressing force by a load of about 14 Kg applied uniformly at a temperature of about 170° C. for about 20 seconds.

(Board Fixing Process A14)

A head unit and a drive control board 62 are attached to a base body 61, to complete an ink jet print head. In this first example of the embodiment, after the drive control board 62 is electrically connected to the head unit through the flexible print circuit 64, the drive control board 62 is fixed to the base body 61 with coupling members such as screws, while the head unit is fixed to the base body by fixing its top cover 66 with coupling members such as screws, to complete the ink jet print head.

(Coupler Bonding Process A15)

It becomes possible to jet ink drops from the nozzles of the ink jet print head through a process comprising the steps of bonding a coupler 68 to the base body 61 of this ink jet print head, injecting ink into the ink manifold member 60 from a separately provided ink injecting apparatus through the coupler 68, connecting a power source to the connector 69 provided on the drive control board 62, and executing a control for jetting ink drops.

Besides, in this first example of the embodiment, the coupler 68 for coupling the tube of the ink injecting apparatus and the liquid room in order to let ink flow into the ink jet head from the ink injecting apparatus is discretely provided, but it is needless to say that, in the case where a base body, a liquid room, or a filter room is provided, this coupler may be integrally built with the filter room. Further, generally speaking, it is put into practice that inspection in respect of specified items is performed in each of the processes and products are sent to the next process; then, at the stage of completion of an ink jet head, ink jetting performance etc. are inspected with a simulated ink and products which have passed the inspection are sent to a delivery process; therefore, the situation is quite the same in this first example of the embodiment, and explanation concerning inspection has been omitted. In addition, the essential points have been explained in the order of the processes; however, modification of processes such as exchanging the orders of processes for the convenience of operation, or making it possible to carry out simultaneously plural operations is not to depart from the essential points of the present invention.

Next, the second example of the embodiment will be explained.

Figure 9:
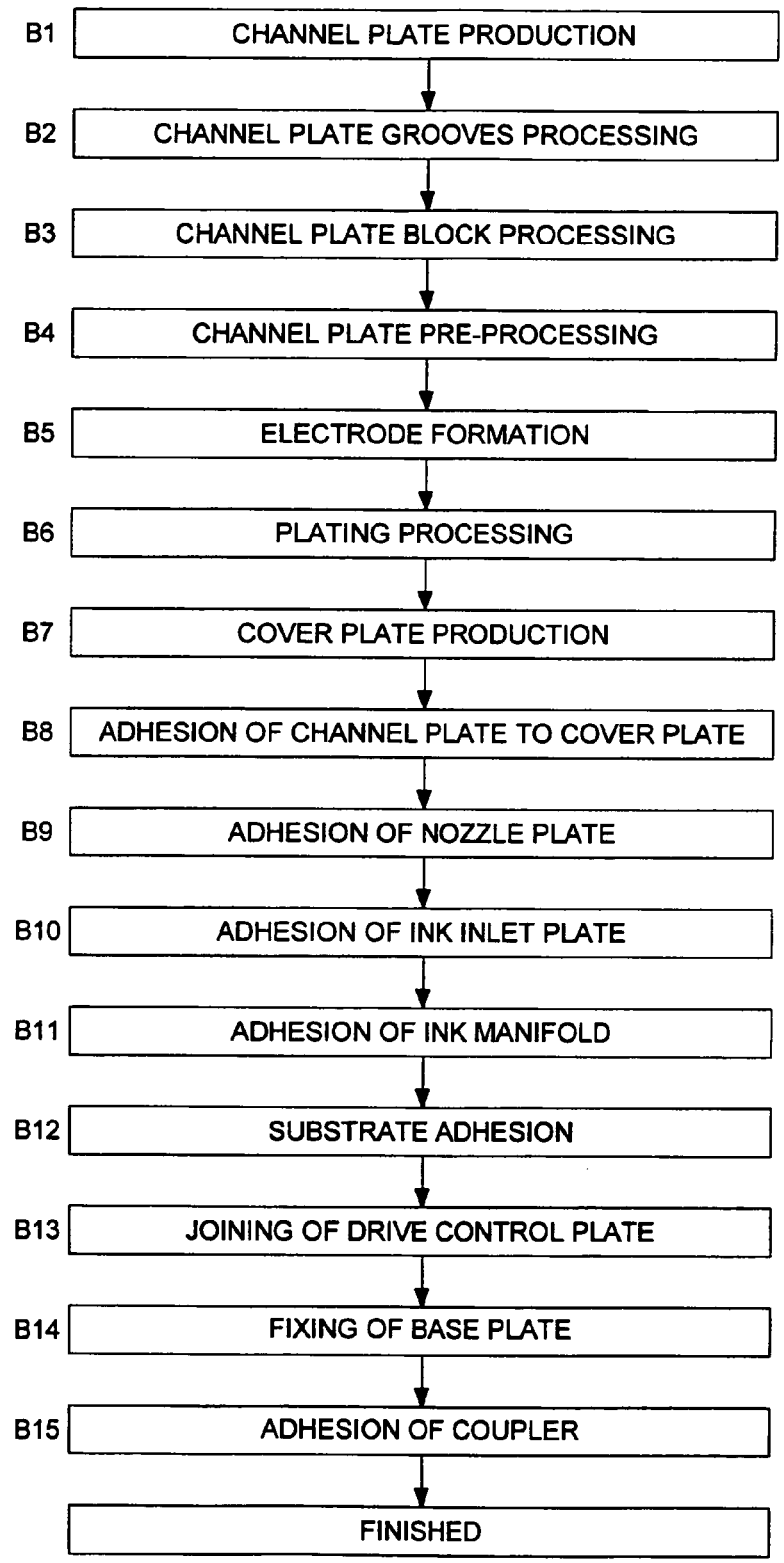
FIG. 9 is a flow chart of a manufacturing process of an ink jet print head.

FIG. 9 is a flow chart of a manufacturing process of an ink jet print head, and FIG. 10(a) to FIG. 10(j) are outline drawings showing a manufacturing process of an ink jet print head.

In the following, this manufacturing process of an ink jet print head will be explained.

Figure 10C:
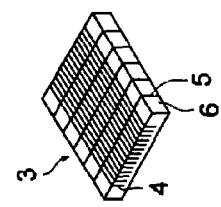
Figure 10B:
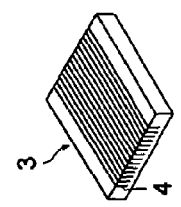
Figure 10A:
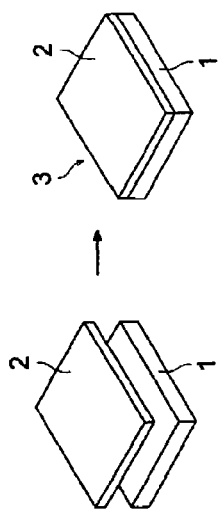
Figure 10G:
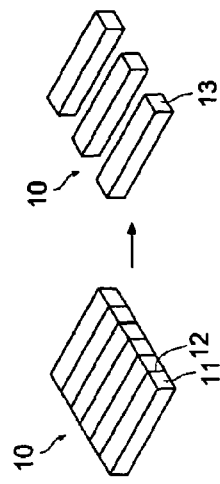

(Processes B1, B2, and B3)—FIG. 10(a) to FIG. 10(c)

Explanation will be omitted because these processes have the same structure as the channel plate producing process A1 etc. in the first example of the embodiment.

(Channel Plate Pre-Treatment Process B4)—FIG. 10(d)

A catalyst is adsorbed on the whole surface of the channel plate.

(Electrode Forming Process B5)—FIG. 10(e)

Electrodes are formed independently for each of the grooves of the channel plate 3, and connection electrodes to transmit a signal to these electrodes are formed on the part ranging from one end surface to the bottom surface of the channel plate 3.

In this second example of the embodiment, Pd (palladium) is used as a catalyst, and an extremely small amount of it having a weight of ng order is adsorbed. As shown in FIG. 3, while nitrogen gas is made to flow, the catalyst layer on the central part of the top surface of a partition wall of a groove of the channel plate 3 is removed by a laser beam along the front and rear direction, and further, the catalyst layer is removed subsequently from the end surface of the channel plate and then from the bottom surface of the channel plate 3, by rotating the channel plate 3 without changing the direction of the laser beam progressing as if the channel plate 3 were sliced by the laser beam.

Figure 10F:
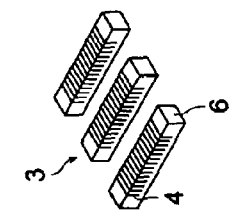
Figure 10J:
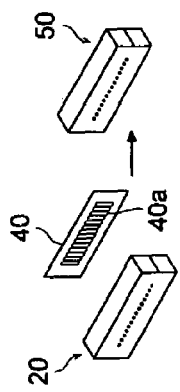
Figure 10I:
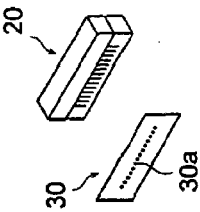
Figure 10H:
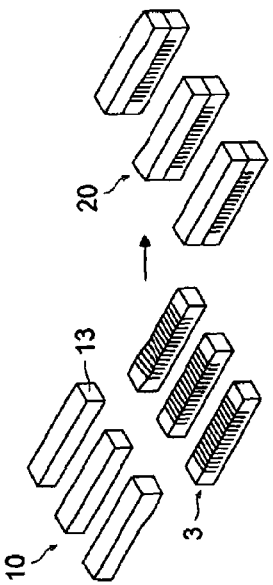

(Plating Process B6)—FIG. 10(f)

The channel plate 3 from which a part of the catalyst layer on the specified portions is removed by a laser beam is subjected to an electroless plating process.

In this way, after the catalyst layer on the portions where plating metal should not be deposited is removed by a laser beam, electrodes and connection electrodes are formed by electroless plating processing on the parts which have not been irradiated by the laser beam. Because an extremely small amount of catalyst is removed by a laser beam, which needs only a very weak irradiation, the laser device becomes simple, thus the deterioration of the property of the piezoelectric body can be prevented.

(Processes B7 to B15)—FIG. 10(g) to FIG. 10(j)

Explanation will be omitted because these processes are the same as the cover plate producing process A7 etc. in the first example of the embodiment.

Next, the third and fourth examples of the embodiment will be explained.

In the following, this manufacturing process of an ink jet print head will be explained.

Figure 11:
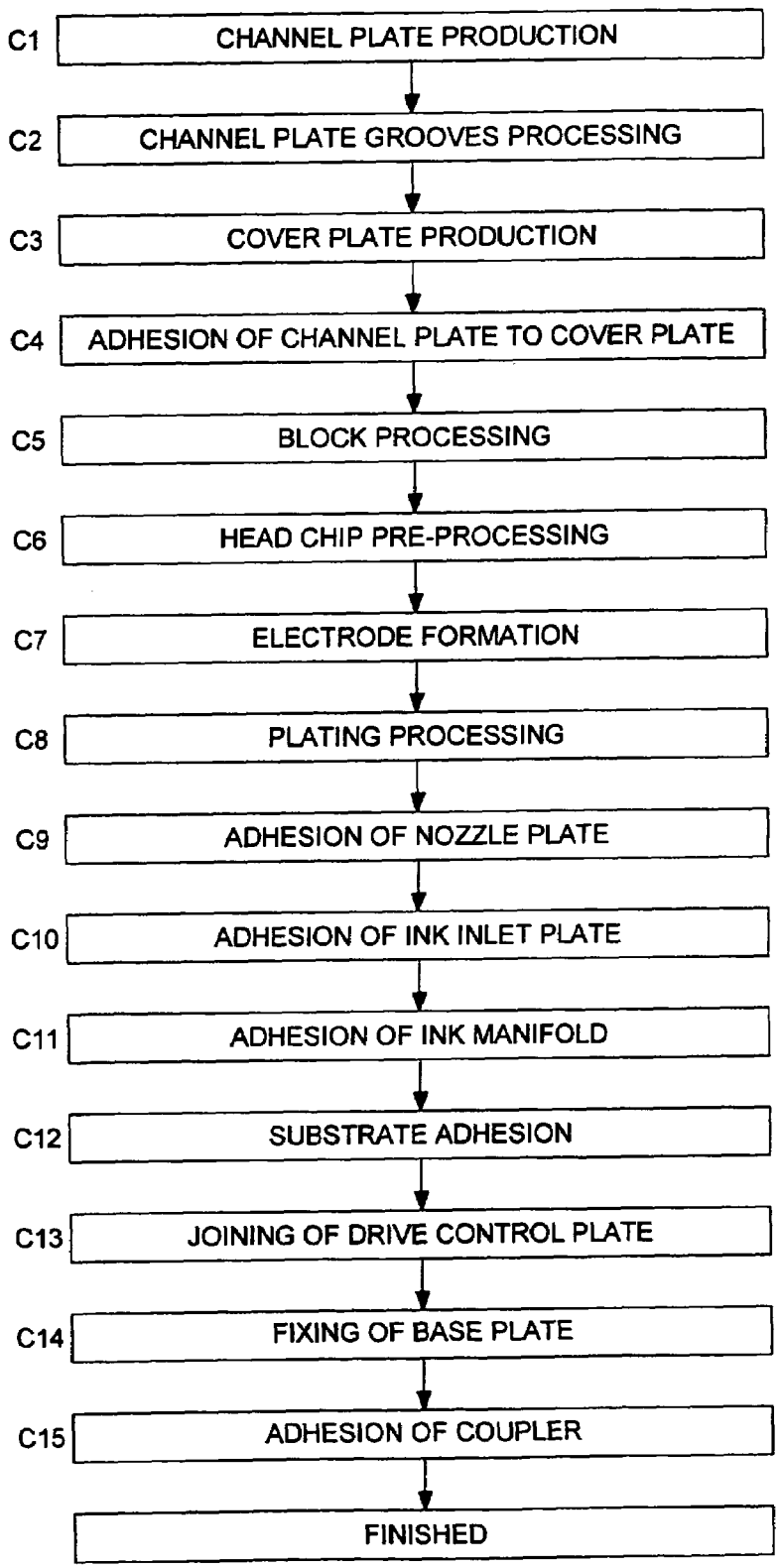
FIG. 11 is a flow chart of a manufacturing process of an ink jet print head.
Figure 13:
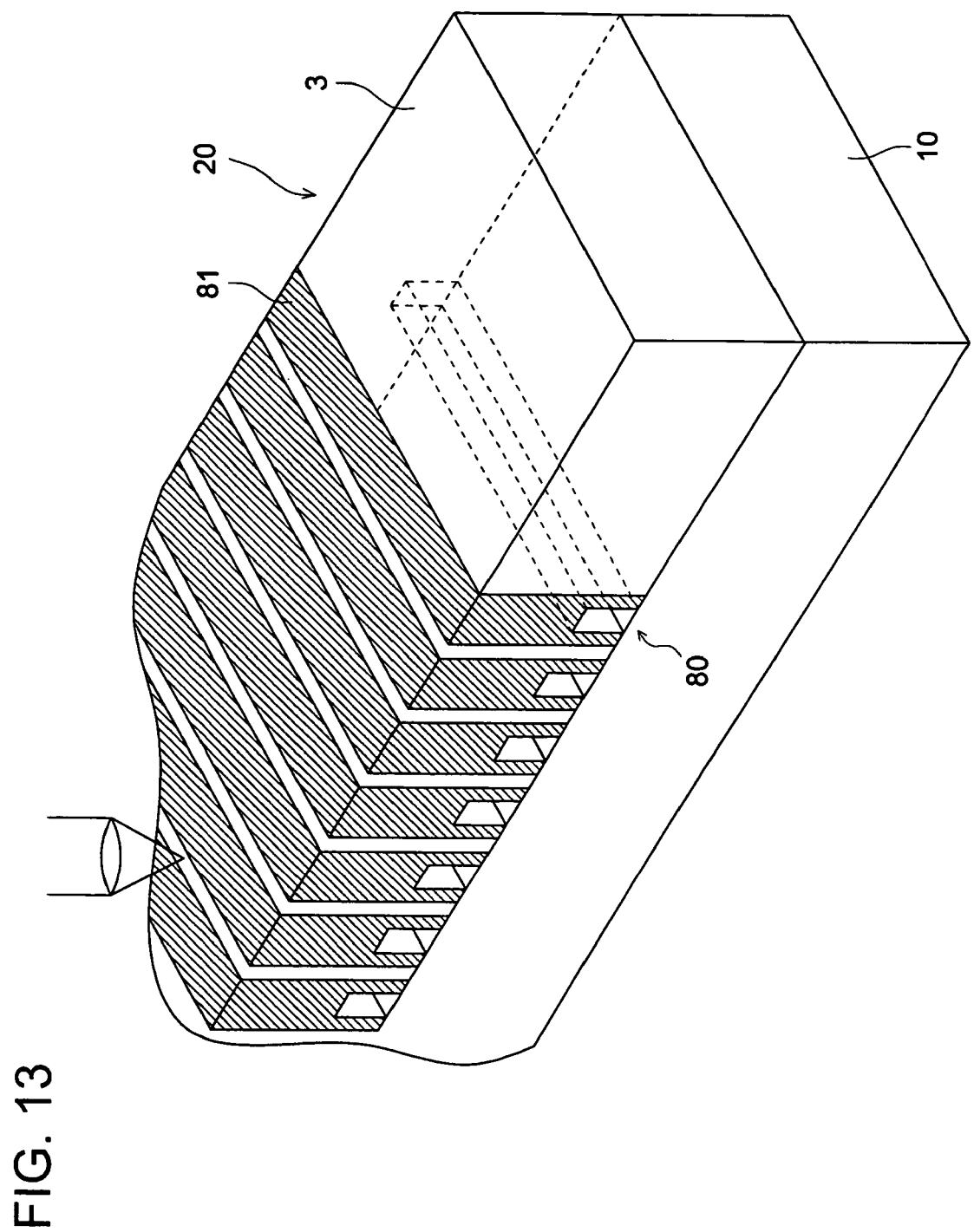
FIG. 13 is a perspective view of a head tip.
Figure 14:
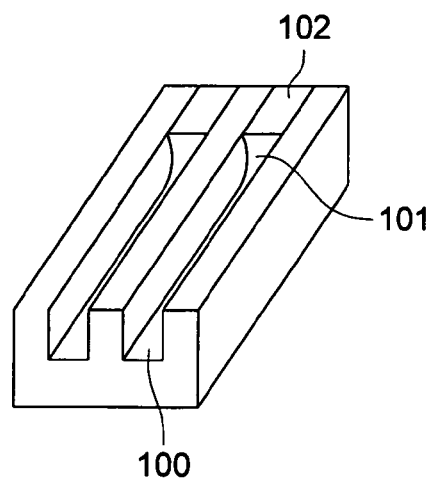
FIG. 14 is a perspective view showing a conventional channel plate.

FIG. 11 is a flow chart of a manufacturing process of an ink jet print head, FIG. 12(a) to FIG. 12(j) are outline drawings showing a manufacturing process of an ink jet print head, and FIG. 13 is a perspective view of a head tip.

(Processes C1 and C2)—FIG. 12(a)

Explanation will be omitted because these processes are the same as the channel plate producing process Al etc. in the first example of the embodiment.

(Cover Plate Producing Process C3)—FIG. 12(c)

A plate member made of PZT having the same width and length as the channel plate 3 which has been worked to form grooves is prepared for a cover plate 10. The same plate member as the thicker plate member which has been used in producing a channel plate is commonly used through depolarization treatment.

(Channel Plate-Cover Plate Bonding Process C4)—FIG. 12(d)

A cover plate 10 is bonded to a channel plate which has been worked to form grooves. Because both have the same size, bonding is carried out by using a fixture or the like so as not to produce positional deviation. An adhesive is uniformly coated by an amount to make a layer of about 2 µm thickness after bonding with heat applied, and bonding is carried out with heat and a load falling within a range of 14 to 20 Kg/cm$^2$ applied at a temperature between 90° C. and 100° C. for about 30 to 40 minutes.

(Block Working Process C5)—FIG. 12(e)

The channel plate 3 and the cover plate 10, which have been bonded to each other, are cut (70) into a plurality of pieces having a shape of a tanzaku of 2 mm width and 44.166 mm length by dicing working, to make a head tip 20.

(Head Tip Pre-Treatment Process C6)—FIG. 12(f)

A catalyst is adsorbed by a head tip, and electroless nickel plating is carried out. When a thin plating film is deposited, the head tip is taken out from the plating bath, is washed by water, and is dried.

(Electrode Forming Process C7)—FIG. 12(g)

A laser beam is applied to the thin plating film, to form a pattern.

(Plating Process C8)—FIG. 12(h)

Plating processing for forming electrodes on a head tip 20 is carried out. In this third example of the embodiment, as shown in FIG. 13, electroless or electrolytic plating is carried out to form a nickel-phosphorous or nickel-boron plating layer of thickness about 2-4 µgm. In another way, plating is done only once. A plating film having a required thickness is formed in the process shown in FIG. 12(f), and the process shown in FIG. 12(h) is omitted.

In this process, it is extremely important to plate uniformly the whole inner wall of the 263 channels (tube-shaped holes of width 70 µm, height 310 µm, and length 2 mm). Also it is appropriate to coat a resist layer on the cover plate part, the nozzle plate bonding part, etc. where no electrode is to be formed so as not to plate these parts. In addition, the material of plating is not limited to this so long as it has a low electric resistance and a high strength against peeling for a PZT material.

(Processes C9 to C15) FIG. 12(i) and FIG. 12(j)

Explanation will be omitted because these processes have the same structure as the nozzle plate bonding process A9 etc. in the first example of the embodiment.

The fifth example of the embodiment is nearly equal to the fourth one; it is a method in which a laser beam is applied in a nitrogen flow after a catalyst is adsorbed, and electroless plating is carried out. The number of times of plating can be reduced.

As described in the foregoing, according to the invention set forth in structure 1, after plating processing to form a layer thinner than the thickness required for electrodes is carried out beforehand, the thin plating film on the portions where no electrode should be formed is removed by a laser beam, and after that, plating processing is done over again. By doing this way, on the thin plating film which remains without being removed, further plating metal is deposited, to form electrodes. Hence, because the laser power for removing the plating film on the unnecessary portions can be lowered, the deterioration of the property of the piezoelectric body to be produced at the time of removing the plating film is prevented, electrode formation with a good production efficiency can be performed, and generation of defective products in the manufacturing process is suppressed, which makes it possible to manufacture a high-precision ink jet print head, whose miniaturization is in progress, at a low cost.

According to the invention set forth in structure 3, by making a plating catalyst adsorbed by a head tip, then removing the catalyst layer on the portions where no plating metal should be deposited by a laser beam, and after that, carrying out plating processing, electrodes are formed only on the portions where the catalyst layer remains. Hence, because there is no need to remove a plating metal layer by a laser beam, the deterioration of the property of the piezoelectric body which is produced at the time of removing a plating metal layer is prevented, electrode formation with a good production efficiency can be performed, and generation of defective products in the manufacturing process is suppressed, which makes it possible to manufacture a high-precision ink jet print head, whose miniaturization is in progress, at a low cost.

According to the invention set forth in structure 4, by forming a plating layer on the inner wall surface of a plurality of tube-shaped channels formed in a head tip and on the outer peripheral surface, and removing the plating layer on specified portions of the outer peripheral surface by a laser beam, a plurality of connection electrodes corresponding to electrodes of channels are formed on the outer peripheral surface of the head tip. Because the partition walls of the grooves which are directly concerned with the jetting of ink drops are not irradiated by a laser beam, and only the portions which are not so much concerned with the jetting of ink drops are irradiated by a laser beam, only a little deterioration is produced even if a thick plating film is removed; therefore, plating for the second time can be omitted. Hence, the deterioration of the property of the piezoelectric body is prevented, electrode formation with a good production efficiency can be performed, and generation of defective products in the manufacturing process is suppressed, which makes it possible to manufacture a high-precision ink jet print head, whose miniaturization is in progress, at a low cost.

According to the invention set forth in structure 5, by depositing a thin plating film on a head tip formed of a channel plate and a cover plate bonded together, then removing the thin plating film on the portions where plating is unnecessary by a laser beam, and after that, carrying out plating processing again, electrodes are formed only on the portions where the thin plating film remains. Hence, because there is no need to remove a thick plating metal film by a laser beam, the deterioration of the property of the piezoelectric body, which may possibly be produced by the laser beam in the plating processing, is prevented, electrode formation with a good production efficiency can be performed, and generation of defective products in the manufacturing process is suppressed, which makes it possible to manufacture a high-precision ink jet print head, whose miniaturization is in progress, at a low cost.

According to the description of the invention of structure 7, after a catalyst layer is adsorbed on a head tip formed of a channel plate and a cover plate bonded to each other, the catalyst on the portions where plating is unnecessary is removed by a laser beam, and plating is carried out. An extremely weak laser beam may be used for removing the catalyst.

Further, in any one of the structures, because the pattern is formed by a laser beam, which makes minute masking processing etc. unnecessary, the head tip can be made small-sized and of high density. Hence, it is possible to lower the voltage for carrying out the jetting of ink drops, also it is possible to make high the frequency of jetting ink drops, the resolution of printed images, and the printing speed. Further, because the head tip can be made small-sized, the amount of PZT to be used, which is a high-priced material, is reduced, and the head has a high performance and a low cost. Moreover, because the head tip can be made small-sized, the degree of freedom in the arrangement of the manifold and the circuit board is raised, the head is light-weighted and compact. Besides, if the head is used in a large-sized printer of a type in which the ink jet print head prints characters etc. as moving, the force of the inertia of the ink jet print head can be made smaller, and the moving velocity can be made higher, which makes it possible to make the printing speed higher.

What is claimed is:

1. A method for manufacturing an ink-jet print head in which ink channels are formed on a member including a piezoelectric body, and ink is jetted from each of the ink channels by applying a voltage to electrodes provided on the piezoelectric body according to each of the ink channels thereby driving the piezoelectric body, the method comprising the steps of:

adsorbing a catalyst onto a channel plate having a plurality of grooves for the ink channels;

removing a part of the catalyst by a laser beam; and plating at least one side surface and a bottom surface of the channel plate, thereby forming a plating layer serving as the electrodes on the catalyst which has not been removed by the laser beam.

2. A method for manufacturing an ink-jet print head in which ink channels are formed on a member including a piezoelectric body, and ink is jetted from each of the ink channels by applying a voltage to electrodes provided on the piezoelectric body thereby driving the piezoelectric body according to each of the ink channels, the method comprising the steps of:

adhering a channel plate having a plurality of grooves for the ink channels and a cover plate together, thereby forming a print head chip;

adsorbing a catalyst on the print head chip;

removing a part of the catalyst formed on an outside surface of the print head chip by a laser beam; and plating an inner wall of each of the plurality of the ink channels and the outside surface of the print head chip, thereby forming a plating layer serving as the electrodes, on the catalyst which has not been removed by the laser beam.

* * * * *